United States Patent
Komatsu et al.

(10) Patent No.: US 11,678,593 B2
(45) Date of Patent: Jun. 13, 2023

(54) SEMICONDUCTOR MEMORY DEVICE WITH A PHASE CHANGE LAYER AND PARTICULAR HEATER MATERIAL

(71) Applicant: Kioxia Corporation, Tokyo (JP)

(72) Inventors: Katsuyoshi Komatsu, Mie (JP); Takeshi Iwasaki, Mie (JP); Tadaomi Daibou, Mie (JP); Hiroki Kawai, Aichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/400,912

(22) Filed: Aug. 12, 2021

(65) Prior Publication Data

US 2022/0238801 A1 Jul. 28, 2022

(30) Foreign Application Priority Data

Jan. 22, 2021 (JP) .............................. JP2021-008890

(51) Int. Cl.
*G11C 13/00* (2006.01)
*H01L 45/00* (2006.01)

(52) U.S. Cl.
CPC .......... *H01L 45/06* (2013.01); *G11C 13/0004* (2013.01); *G11C 13/0069* (2013.01); *H01L 45/144* (2013.01)

(58) Field of Classification Search
CPC ... H01L 45/06; H01L 45/144; G11C 13/0004; G11C 13/0069; G11C 2213/15; G11C 11/0097
See application file for complete search history.

(56) References Cited

U.S. PATENT DOCUMENTS

| 9,780,144 B2 | 10/2017 | Seong et al. |
| 2011/0062405 A1* | 3/2011 | Tsukamoto ......... H01L 45/1625 257/E45.002 |
| 2017/0244026 A1* | 8/2017 | Wu ....................... H01L 45/126 |
| 2020/0274063 A1* | 8/2020 | Furuhashi ........... H01L 27/2409 |

(Continued)

FOREIGN PATENT DOCUMENTS

| JP | 2011-018838 A | 1/2011 |
| JP | 2021-022711 A | 2/2021 |
| TW | 201733023 | 9/2017 |

OTHER PUBLICATIONS

May, A.F. et al. Thermoelectric performance of lanthanum telluride produced via mechanical alloying. Physical Review B 78, 125205, 2008 (Year: 2008).*

(Continued)

*Primary Examiner* — Jerome Leboeuf
(74) *Attorney, Agent, or Firm* — Foley & Lardner LLP

(57) ABSTRACT

A semiconductor memory device includes a first electrode and a second electrode, a phase change layer disposed between the first electrode and the second electrode, and a first layer disposed between the first electrode and the phase change layer. The phase change layer contains at least one of germanium (Ge), antimony (Sb), and tellurium (Te). The first layer contains aluminum (Al) and antimony (Sb), or tellurium (Te) and at least one of zinc (Zn), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

17 Claims, 10 Drawing Sheets

(56) References Cited

U.S. PATENT DOCUMENTS

2020/0388752 A1 12/2020 Bai et al.
2021/0036218 A1 2/2021 Ode
2022/0115590 A1* 4/2022 Khan ................. H01L 45/1233

OTHER PUBLICATIONS

Taiwanese Office Action for Application No. TW201733023 dated Mar. 3, 2022.

* cited by examiner

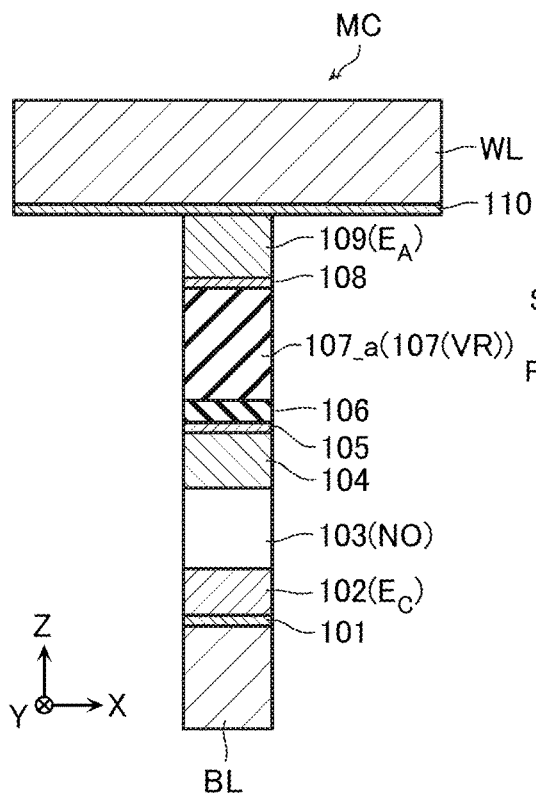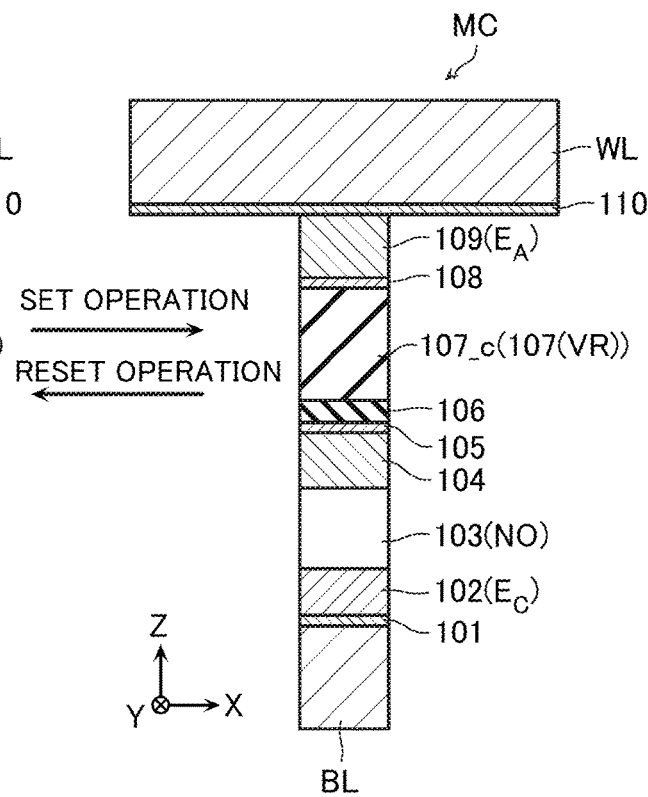

SEMICONDUCTOR MEMORY DEVICE WITH A PHASE CHANGE LAYER AND PARTICULAR HEATER MATERIAL

CROSS-REFERENCE TO RELATED APPLICATIONS

This application is based upon and claims the benefit of Japanese Patent Application No. 2021-008890, filed on Jan. 22, 2021, the entire contents of which are incorporated herein by reference.

BACKGROUND

Field

This embodiment relates to a semiconductor memory device.

Description of the Related Art

There has been known a semiconductor memory device that includes a first electrode, a second electrode, and a phase change layer disposed between the first electrode and the second electrode. The phase change layer contains germanium (Ge), antimony (Sb), tellurium (Te), and the like.

BRIEF DESCRIPTION OF THE DRAWINGS

FIG. 5A is a schematic cross-sectional view for describing a write operation of the memory cell MC according to the first embodiment;

FIG. 5B is a schematic cross-sectional view for describing the write operation of the memory cell MC according to the first embodiment;

DETAILED DESCRIPTION

Figure 1:
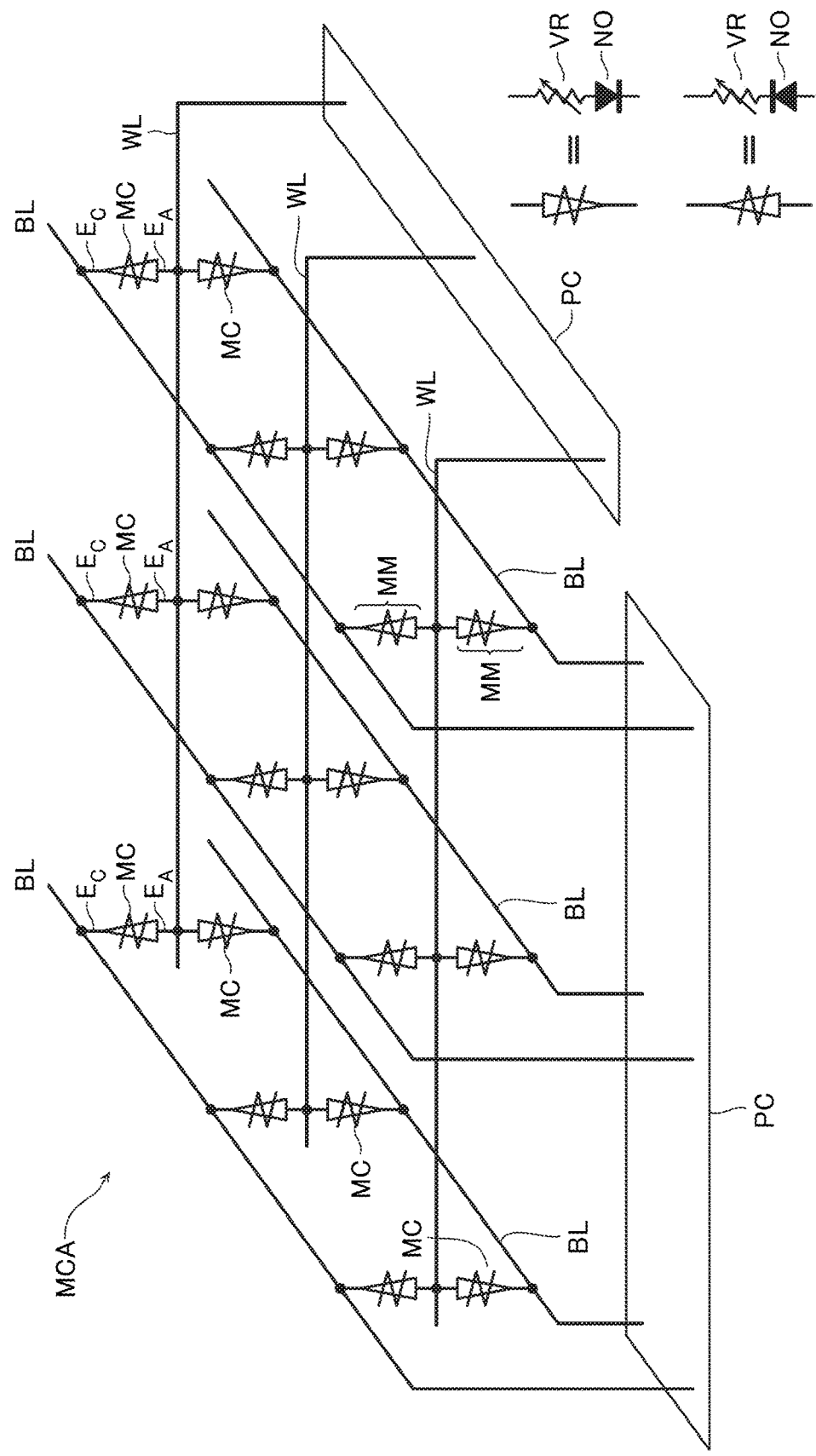
FIG. 1 is a schematic circuit diagram illustrating a part of a configuration of a semiconductor memory device according to a first embodiment.

A semiconductor memory device according to one embodiment comprises: a first electrode and a second electrode; a phase change layer disposed between the first electrode and the second electrode; and a first layer disposed between the first electrode and the phase change layer. The phase change layer contains a cubic crystal, and the first layer contains a crystal having a sphalerite structure or a face-centered cubic lattice structure.

Next, the semiconductor memory devices according to embodiments are described in detail with reference to the drawings. The following embodiments are only examples, and not described for the purpose of limiting the present invention. The following drawings are schematic, and for convenience of description, apart of a configuration and the like is sometimes omitted. Parts common in a plurality of embodiments are attached by same reference numerals and their descriptions may be omitted.

In this specification, a direction parallel to a surface of the substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, when the first direction intersects with the surface of the substrate, a direction away from the substrate along the first direction is referred to as above and a direction approaching the substrate along the first direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the second direction or the third direction is referred to as a side surface and the like.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor. In this specification, when referring to that the first configuration "is electrically insulated" from the second configuration, this means, for example, a state where an insulating layer or the like is disposed between the first configuration and the second configuration while a contact, a wiring, or the like to connect the first configuration to the second configuration is not disposed.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

A circuit configuration of a semiconductor memory device according to the embodiment is described with reference to the drawings. The following drawings are schematic, and for convenience of explanation, a part of a configuration is sometimes omitted.

First Embodiment

[Schematic Configuration]

Figure 2:
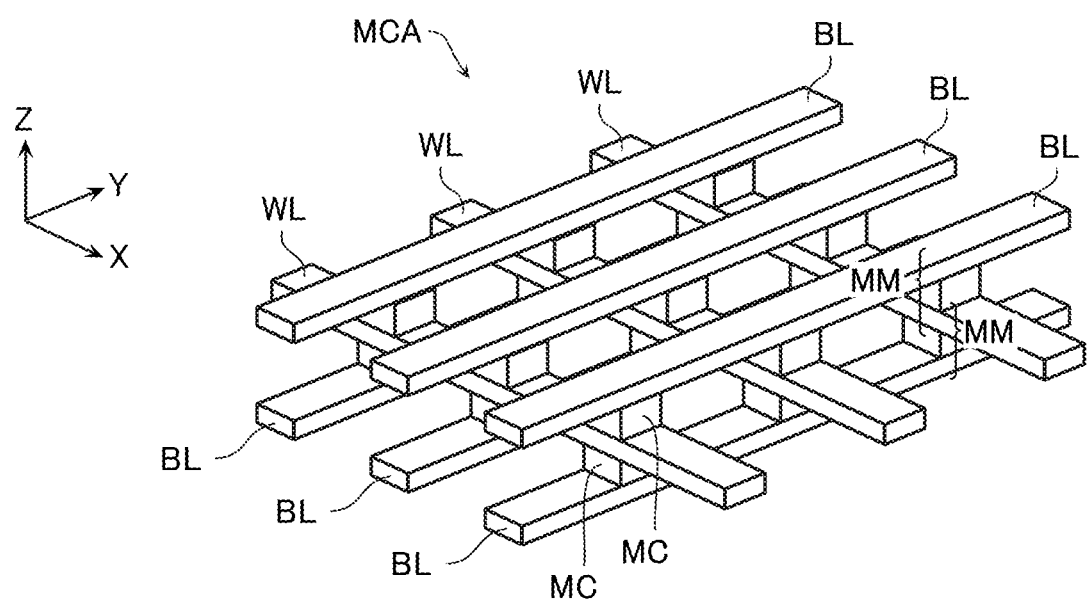
FIG. 2 is a schematic perspective view illustrating a part of the configuration of the semiconductor memory device.

FIG. 1 is a schematic circuit diagram illustrating a part of a configuration of a semiconductor memory device according to the first embodiment. FIG. 2 is a schematic perspective view illustrating a part of the configuration of the semiconductor memory device.

The semiconductor memory device according to the embodiment includes a memory cell array MCA and a peripheral circuit PC that controls the memory cell array MCA.

For example, as illustrated in FIG. 2, the memory cell array MCA includes a plurality of memory mats MM arranged in the Z-direction. The memory mat MM includes bit lines BL, word lines WL, and memory cells MC. The plurality of bit lines BL are arranged in the X-direction and extend in the Y-direction. The plurality of word lines WL are arranged in the Y-direction and extend in the X-direction. The plurality of memory cells MC are arranged in the X-direction and the Y-direction corresponding to the bit lines BL and the word lines WL. As illustrated in the drawing, regarding the two memory mats MM arranged in the Z-direction, the bit line BL or the word line WL may be disposed in common. In the example of FIG. 1, a cathode EC of the memory cell MC is connected to the bit line BL. Additionally, an anode EA of the memory cell MC is connected to the word line WL. The memory cell MC includes a variable resistance element VR and a nonlinear element NO.

The peripheral circuits PC are connected to the bit lines BL and the word lines WL. The peripheral circuit PC includes a step down circuit, a select circuit, a sense amplifier circuit, a sequencer that controls them, and the like. The step down circuit steps down, for example, a power supply voltage and outputs the power supply voltage to a voltage supply line. The select circuit electrically conducts the bit line BL and the word line WL corresponding to a selected address with the corresponding voltage supply line. The sense amplifier circuit outputs data of 0 or 1 according to a voltage or a current of the bit line BL.

[Configuration of Memory Cell MC]

Figure 3A:
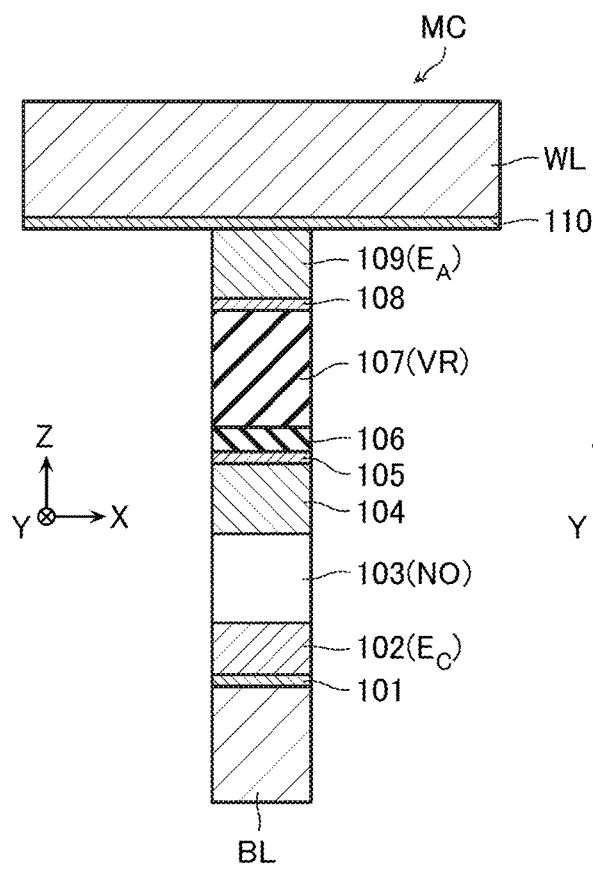
FIG. 3A is a schematic cross-sectional view of a memory cell MC of the semiconductor memory device.
Figure 3B:
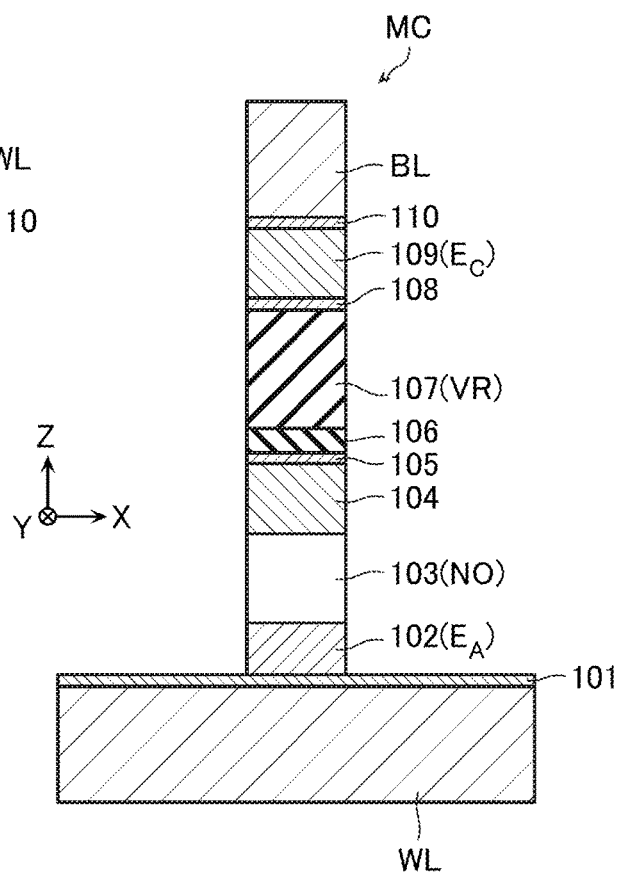
FIG. 3B is a schematic cross-sectional view of the memory cell MC of the semiconductor memory device.

FIG. 3A and FIG. 3B are schematic cross-sectional views of the memory cell MC according to the embodiment. FIG. 3A corresponds to one that includes the bit line BL below and the word line WL above. FIG. 3B corresponds to one that includes the word line WL below and the bit line BL above.

The memory cell MC illustrated in FIG. 3A includes a conductive layer 102, a chalcogen layer 103, a conductive layer 104, a barrier conductive layer 105, a crystallization accelerating layer 106, a chalcogen layer 107, a barrier conductive layer 108, and a conductive layer 109 stacked on a barrier conductive layer 101 on a top surface of the bit line BL in the order. On the conductive layer 109, a barrier conductive layer 110 on a lower surface of the word line WL is disposed.

The barrier conductive layer 101 functions as a part of the bit line BL. For example, the barrier conductive layer 101 may be tungsten nitride (WN), titanium nitride (TiN), or the like, and may be any conductive layer of tungsten carbonitride (WCN), tungsten carbonitride silicide (WCNSi), or the like.

The conductive layer 102 is connected to the bit line BL disposed immediately below the memory cell MC and functions as the cathode EC of the memory cell MC. For example, the conductive layer 102 may be carbon (C), carbon nitride (CN), or the like, and may be tungsten (W), tungsten nitride (WN), titanium (Ti), titanium nitride (TiN), vanadium (V), vanadium nitride (VN), zirconium (Zr), zirconium nitride (ZrN), hafnium (Hf), hafnium nitride (HfN), yttrium (Y), yttrium nitride (YN), scandium (Sc), scandium nitride (ScN), tantalum (Ta), tantalum nitride (TaN), molybdenum (Mo), rhenium (Re), niobium (Nb), aluminum (Al), and the like. The conductive layer 102 may be, for example, a polycrystalline silicon in which N-type impurities of phosphorus (P) or the like is implanted, and may be any conductive layer of tungsten carbide (WC), tungsten carbonitride (WCN), tungsten carbonitride silicide (WCNSi), or the like.

The chalcogen layer 103 functions as the nonlinear element NO. For example, in a case where a voltage lower than a predetermined threshold is applied to the chalcogen layer 103, the chalcogen layer 103 is in a high resistance state. When the voltage applied to the chalcogen layer 103 reaches the predetermined threshold, the chalcogen layer 103 becomes a low resistance state and a current flowing through the chalcogen layer 103 increases by a plurality of digits. When the voltage applied to the chalcogen layer 103 falls below the predetermined voltage for a constant period, the chalcogen layer 103 becomes the high resistance state again.

The chalcogen layer 103 contains, for example, at least one chalcogen. The chalcogen layer 103 may contain, for example, a chalcogenide, which is a compound containing chalcogen. Additionally, the chalcogen layer 103 may contain at least one element selected from the group consisting of B, N, Al, Zn, Ga, In, C, Si, Ge, Sn, As, P, and Sb.

Note that the chalcogen here means one other than oxygen (O) among elements belonging to the group 16 of the periodic table. The chalcogen includes, for example, sulfur (S), selenium (Se), and tellurium (Te).

The conductive layer 104 functions as an electrode that connects the nonlinear element NO to the variable resistance element VR. The conductive layer 104 may contain, for example, a material similar to that of the conductive layer 102.

The barrier conductive layer 105 may contain, for example, a material similar to that of the barrier conductive layer 101. The crystallization accelerating layer 106 contacts a surface on the cathode EC side of the chalcogen layer 107 and functions as a crystalline base (template) configured to control a crystalline structure of the chalcogen layer 107. The crystallization accelerating layer 106 contains, for example, a cubic crystal. The cubic crystal is a crystal having a sphalerite structure, a crystal having a face-centered cubic (fcc) lattice structure (hereinafter referred to as "fcc crystal"), and the like. The crystallization accelerating layer 106 has at least one layers made of member atoms described later.

The crystallization accelerating layer 106 also functions as a heater that supplies the chalcogen layer 107 with a heat necessary for a set operation and a reset operation described later. For the function as the effective heater, the crystallization accelerating layer 106 includes a material having a relatively large bandgap, that is, having a relatively low electrical conductivity as described later.

The crystallization accelerating layer 106 also functions as a heat shield member. For reducing Joule heat generated in the crystallization accelerating layer 106 that easily dissipates to the chalcogen layer 103 side, the crystallization accelerating layer 106 includes a material having a relatively low thermal conductivity as described later.

The chalcogen layer 107 functions as the variable resistance element VR. For example, by heating at a melting temperature or more and rapid cooling, the chalcogen layer 107 becomes an amorphous state (reset state: high resistance state). Moreover, for example, by heating at a temperature lower than a melting temperature and higher than a crystallization temperature, the chalcogen layer 107 becomes a crystalline state (set state: low resistance state).

The chalcogen layer 107 contains, for example, at least one chalcogen. The chalcogen layer 107 may contain, for example, a chalcogenide, which is a compound containing chalcogen. The chalcogen layer 107 may be, for example, GeSbTe, GeCuTe, GeTe, SbTe, and SiTe. The chalcogen layer 107 may contain at least one element selected from germanium (Ge), antimony (Sb), and tellurium (Te). The chalcogen layer 107 may contain nitrogen (N), carbon (C), boron (B), and the like.

The barrier conductive layer 108 may contain, for example, a material similar to that of the barrier conductive layer 101.

The conductive layer 109 is connected to the word line WL disposed immediately above the memory cell MC and functions as the anode EA of the memory cell MC. The conductive layer 109 may contain, for example, a material similar to that of the conductive layer 102.

The barrier conductive layer 110 functions as a part of the word line WL. The barrier conductive layer 110 may contain, for example, a material similar to that of the barrier conductive layer 101.

The memory cell MC illustrated in FIG. 3B is basically configured similarly to the memory cell MC illustrated in FIG. 3A. However, in the memory cell MC illustrated in FIG. 3B, the barrier conductive layer 110 functions as a part of the bit line BL rather than the barrier conductive layer 101, and the barrier conductive layer 101 functions as a part of the word line WL rather than the barrier conductive layer 110. Further, not the conductive layer 102 but the conductive layer 109 functions as the cathode EC, and not the conductive layer 109 but the conductive layer 102 functions as the anode EA.

[Electrical Characteristics of Memory Cell MC]

Figure 4:
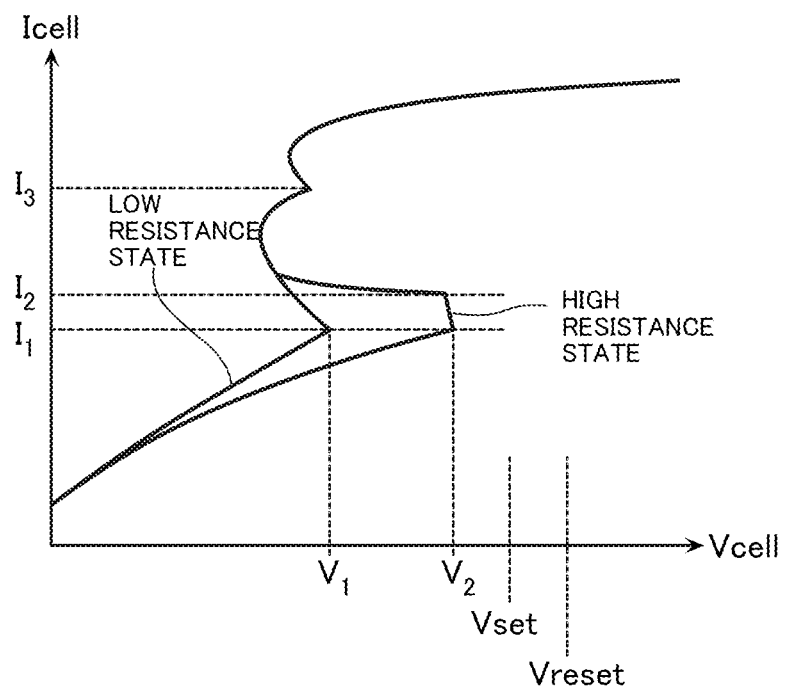
FIG. 4 is a schematic graph illustrating current-voltage characteristics of the memory cell MC of the semiconductor memory device.

FIG. 4 is a schematic graph illustrating current-voltage characteristics of the memory cell MC according to the embodiment. The horizontal axis indicates a voltage of the anode EA (hereinafter referred to as "cell voltage Vcell") when a voltage of the cathode EC of the memory cell MC is set as a reference. The vertical axis indicates a current flowing through the memory cell MC (hereinafter referred to as "cell current Icell") by logarithmic axis.

In a range where a value of the cell current Icell is smaller than a value of a predetermined current value I1, the cell voltage Vcell monotonously increases according to an increase in the cell current Icell. At a point when the cell current Icell reaches the current value I1, the cell voltage Vcell of the memory cell MC in the low resistance state reaches a voltage V1. The cell voltage Vcell of the memory cell MC in the high resistance state reaches a voltage V2. The voltage V2 is higher than the voltage V1.

In a range where the value of the cell current Icell is larger than a value of a current value I1 and smaller than a current value I2, the cell voltage Vcell monotonously decreases according to an increase in the cell current Icell. In the range, the cell voltage Vcell of the memory cell in the high resistance state is higher than the cell voltage Vcell of the memory cell MC in the low resistance state.

In a range where the cell current Icell is larger than the current value I2 and smaller than a current value I3, the cell voltage Vcell temporarily decreases according to the increase in the cell current Icell and increases thereafter. In the range, according to the increase in the cell current Icell, the cell voltage Vcell of the memory cell MC in the high resistance state rapidly decreases and becomes approximately the same as the cell voltage Vcell of the memory cell MC in the low resistance state.

In a range where the cell current Icell is larger than the current value I3, the cell voltage Vcell temporarily decreases according to the increase in the cell current Icell and increases thereafter.

In a case where the cell current Icell is rapidly reduced down to a magnitude smaller than the current value I1 from this state, the chalcogen layer 107 becomes the high resistance state. Alternatively, in a case where the cell current Icell decreases to a predetermined magnitude and the cell current Icell decreases after the state is maintained for a certain period of time, the chalcogen layer 107 becomes the low resistance state.

[Operation]

FIG. 5A and FIG. 5B are schematic cross-sectional views for describing a write operation of the memory cell MC according to the embodiment. FIG. 5A and FIG. 5B illustrate a set operation and a reset operation as examples of the write operation. The set operation is an operation that causes the memory cell MC to transition from the high resistance state to the low resistance state. The reset operation is an operation that causes the memory cell MC to transition from the low resistance state to the high resistance state.

FIG. 5A illustrates a state of the memory cell MC after performing the reset operation, and FIG. 5B illustrates a state of the memory cell MC after performing the set operation.

Note that, in the following description, an example where the main component of the chalcogen layer 107 is $Ge_2Sb_2Te_5$ will be described.

When the reset operation is performed on the memory cell MC illustrated in FIG. 5B, as illustrated in FIG. 5A, a chalcogen layer 107_a in the amorphous state is formed in the chalcogen layer 107. In the reset operation, for example, the cell voltage Vcell is adjusted to a reset voltage Vreset larger than the voltage V2 (FIG. 4). Thus, a current flows through the memory cell MC and Joule heat is generated in the chalcogen layer 107. A large amount of Joule heat is generated also from the crystallization accelerating layer 106, and supplied to the chalcogen layer 107. This is because the crystallization accelerating layer 106 has an electrical resistance higher than that of the chalcogen layer 107. The Joule heat at this point has a magnitude to a degree at which the whole of the chalcogen layer 107 melts. Next, the cell voltage Vcell decreases to 0 V. Thus, the Joule heat is no longer supplied to the chalcogen layer 107, and the melted chalcogen layer 107 is rapidly cooled. During this period, a period required for crystallization is not given to the chalcogen layer 107. Therefore, the chalcogen layer 107 is solidified as the amorphous state (reset state: high resistance state), thus forming the chalcogen layer 107_a in the amorphous state.

When the set operation is performed on the memory cell MC illustrated in FIG. 5A, as illustrated in FIG. 5B, the chalcogen layer 107_a in the amorphous state becomes a chalcogen layer 107_c in the crystalline state. In the set operation, for example, the cell voltage Vcell is adjusted to be a set voltage Vset smaller than the reset voltage Vreset and the state is held for a certain period of time. Accordingly, the current flows to the memory cell MC while the Joule heat is supplied to the chalcogen layer 107_a. The Joule heat at this point has a magnitude to a degree at which the chalcogen layer 107_a is crystallized but the melting does not occur. Additionally, the set voltage Vset is held for a required period for the chalcogen layer 107_a to be crystallized. Afterwards, the cell voltage Vcell is set to 0 V. Thus, the chalcogen layer 107_a in the amorphous state becomes the chalcogen layer 107_c in the crystalline state (set state: low resistance state).

Note that, in the set operation, the crystal of $Ge_2Sb_2Te_5$ in the chalcogen layer 107 grows with a crystal face of the cubic crystal contained in the crystallization accelerating layer 106, such as the crystal having the sphalerite structure or the fcc crystal, as its base. Accordingly, the $Ge_2Sb_2Te_5$ in the chalcogen layer 107_c is generated mainly as the fcc crystal that is the cubic crystal.

After that, similarly, when the reset operation is performed on the memory cell MC illustrated in FIG. 5B, the chalcogen layer 107_c in the crystalline state becomes the chalcogen layer 107_a in the amorphous state. When the set operation is performed on the memory cell MC illustrated in FIG. 5A, the chalcogen layer 107_a in the amorphous state becomes the chalcogen layer 107_c in the crystalline state.

Comparative Example

Figure 6A:
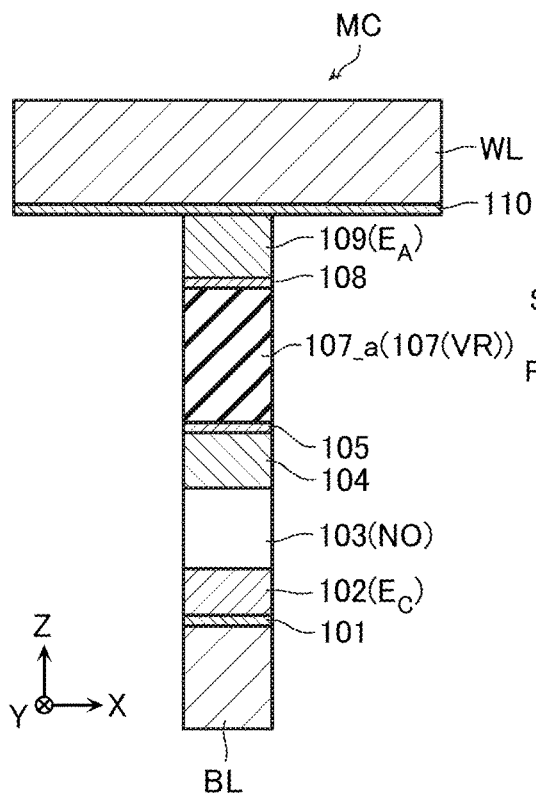
FIG. 6A is a schematic cross-sectional view for describing a write operation of a memory cell MC according to a comparative example.
Figure 6B:
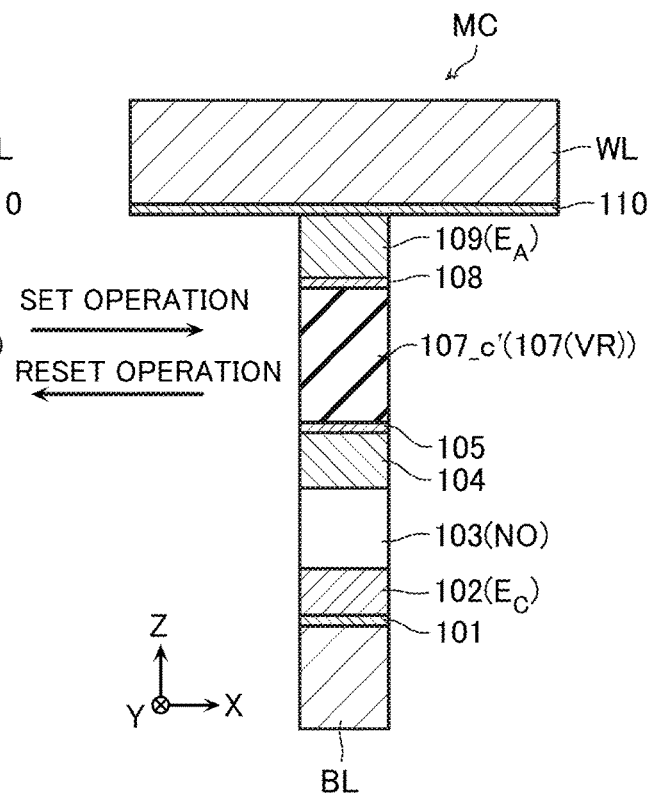
FIG. 6B is a schematic cross-sectional view for describing the write operation of the memory cell MC according to the comparative example.

FIG. 6A and FIG. 6B are schematic cross-sectional views for describing the write operation of the memory cell MC according to the comparative example. The memory cell MC according to the comparative example is basically configured similarly to the memory cell MC according to the first embodiment. However, the memory cell MC according to the comparative example does not include the crystallization accelerating layer 106.

FIG. 6A illustrates a state of the memory cell MC after performing the reset operation, and FIG. 6B illustrates a state of the memory cell MC after performing the set operation.

As illustrated in FIG. 6A and FIG. 6B, the set operation and the reset operation of the memory cell MC according to the comparative example are performed similarly to the set operation and the reset operation of the memory cell MC according to the first embodiment. However, in the memory cell MC according to the comparative example, not the chalcogen layer 107_c but a chalcogen layer 107_c' is formed after the set operation.

In the memory cell MC according to the comparative example, it takes a longer time period than the first embodiment for completing the crystallization from the chalcogen layer 107_a to the chalcogen layer 107_c' in the set operation. In this respect, since the crystallization accelerating layer 106 in contact with the chalcogen layer 107_c' is not disposed, there is no base surface in the crystal growth of the chalcogen layer 107_a, thus allowing the member atoms of the chalcogen layer 107 to mutually freely move. In this state, crystal nuclei that seed the crystallization are repeatedly generated and disappear inside the chalcogen layer 107, and consequently, the time period until the crystallization completion becomes longer. Additionally, since the crystallization accelerating layer 106 that controls an orientation in the crystal growth to the chalcogen layer 107_c' is not disposed, the fcc crystal is less likely to be generated in the chalcogen layer 107_c'.

The memory cell MC according to the comparative example does not include the crystallization accelerating layer 106 that functions as the heater. Therefore, the heat necessary for the set operation and the reset operation cannot be efficiently supplied to the chalcogen layer 107, thus increasing the time period until the completion of the set operation and the reset operation compared with the first embodiment.

The memory cell MC according to the comparative example does not include the crystallization accelerating layer 106 that also functions as the heat shield member. Therefore, the Joule heat generated in the chalcogen layer 107 easily escapes to the chalcogen layer 103 side, thus increasing the time period until the completion of the set operation and the reset operation compared with the first embodiment.

[Effect]

For performing the high-speed write operation, the speed-up of both the set operation and the reset operation is required.

For performing the high-speed set operation, especially, the time period until the crystallization completion of the chalcogen layer 107 is preferably reduced.

Therefore, in this embodiment, for example, as described with reference to FIG. 3A and FIG. 3B, the crystallization accelerating layer 106 containing the cubic crystals is disposed in the cathode EC side of the chalcogen layer 107. In this structure, as described above, the crystal with the fcc structure as the cubic crystal can be generated at high speed in the chalcogen layer 107 during the set operation.

Next, for performing the high-speed reset operation, it is preferred that the total heat quantity necessary for melting the crystallized chalcogen layer 107_c is reduced, and that the heat of melting can be effectively supplied to the chalcogen layer 107_c.

The total heat quantity necessary for melting the chalcogen layer 107_c differs depending on the crystalline structure, the composition, and the like of the chalcogen layer 107_c. Therefore, $Ge_2Sb_2Te_5$ is described as an exemplary chalcogen layer 107.

$Ge_2Sb_2Te_5$ has a hexagonal close-packed (hcp) lattice structure as the crystalline structure in a stable state, and has the fcc lattice structure as the crystalline structure in a metastable state. Here, it has been known that $Ge_2Sb_2Te_5$ with the fcc lattice structure is melted with heat energy smaller than that of $Ge_2Sb_2Te_5$ with the hcp lattice structure. Therefore, when a large amount of crystal having the fcc structure is contained in the chalcogen layer 107_c, the total heat quantity necessary for melting can be reduced.

However, it is sometimes difficult to generate the crystal having the fcc lattice structure in the chalcogen layer 107_c. Especially, in a case where the set operation is performed while, for example, the entire semiconductor memory device has a high temperature due to its long-term use, a proportion of the crystal having the hcp lattice structure increases in some cases.

Therefore, in this embodiment, as described above, the crystallization accelerating layer 106 containing the cubic crystal is disposed. In this structure, as described above, $Ge_2Sb_2Te_5$ having the fcc lattice structure can be stably generated in the chalcogen layer 107_c during the set operation. Accordingly, during the reset operation, the total heat quantity necessary for melting the chalcogen layer 107_c can be reduced, and the high-speed reset operation can be achieved.

[Configuration of Crystallization Accelerating Layer 106]
[Crystalline Structure of Crystallization Accelerating Layer 106]

As described with reference to FIG. 3A and FIG. 3B, the crystallization accelerating layer 106 contains the crystal with the sphalerite structure, the fcc crystal, or the like, which is the cubic crystal.

The material constituting the crystal with the sphalerite structure includes AlSb (0.614 nm), ZnTe (0.611 nm), and the like (the value in parentheses indicates the lattice constant of the crystal of the sphalerite structure containing each material). For example, the crystallization accelerating layer 106 may contain aluminum (Al) and antimony (Sb), or tellurium (Te) and zinc (Zn) constituting these materials.

The material constituting the fcc crystal includes LaTe (0.642 nm), CeTe (0.636 nm), PrTe (0.632 nm), NdTe (0.626 nm), SmTe (0.659 nm), EuTe (0.659 nm), GdTe (0.614 nm), TbTe (0.610 nm), DyTe (0.609 nm), HoTe (0.605 nm), ErTe (0.606 nm), TmTe (0.604 nm), YbTe (0.635 nm), LuTe (0.595 nm), and the like (the value in parentheses indicates the lattice constant of the fcc crystal containing each material). The crystallization accelerating layer 106 may contain, as constituents of these materials, for example, tellurium (Te) and at least one of zinc (Zn), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

Additionally, the lattice constant of the crystal with the sphalerite structure or the fcc crystal contained in the crystallization accelerating layer 106 is preferably close to the lattice constant of the fcc crystal contained in the chalcogen layer 107_c. This is because, when these crystals have the lattice constants close to one another, the crystalline structure of the crystal contained in the chalcogen layer 107_c is more preferably controllable. Especially, the lattice constant of the crystal contained in the crystallization accelerating layer 106 is preferably larger than 90% and smaller than 110% of the lattice constant of the crystal contained in the chalcogen layer 107.

The case where the chalcogen layer 107 contains $Ge_2Sb_2Te_5$ will be described as an example. Since the lattice constant of the fcc crystal of $Ge_2Sb_2Te_5$ is 0.598 nm, the crystal contained in the crystallization accelerating layer 106 preferably has the lattice constant the same extent to this lattice constant. The material of the crystallization accelerating layer 106 is preferably, for example, AlSb (0.614 nm), ZnTe (0.611 nm), LaTe (0.642 nm), CeTe (0.636 nm), PrTe (0.632 nm), NdTe (0.626 nm), GdTe (0.614 nm), TbTe (0.610 nm), DyTe (0.609 nm), HoTe (0.605 nm), ErTe (0.606 nm), TmTe (0.604 nm), YbTe (0.635 nm), and LuTe (0.595 nm) (the value in parentheses indicates the lattice constant of each material).

The case where the chalcogen layer 107 contains $GeCu_2Te_3$ will be described as an example. Since the lattice constant of the fcc crystal of $GeCu_2Te_3$ is 0.599 nm, the crystal contained in the crystallization accelerating layer 106 preferably has the lattice constant the same extent to this lattice constant. The material of the crystallization accelerating layer 106 is preferably, for example, AlSb (0.614 nm), ZnTe (0.611 nm), LaTe (0.642 nm), CeTe (0.636 nm), PrTe (0.632 nm), NdTe (0.626 nm), SmTe (0.659 nm), EuTe (0.659 nm), GdTe (0.614 nm), TbTe (0.610 nm), DyTe (0.609 nm), HoTe (0.605 nm), ErTe (0.606 nm), TmTe (0.604 nm), YbTe (0.635 nm), and LuTe (0.595 nm) (the values in the parentheses indicate the lattice constants).

In the case where the chalcogen layer 107 contains another material, the lattice constant of the crystal contained in the crystallization accelerating layer 106 is preferably larger than 90% and smaller than 110% of the lattice constant of the crystal contained in the chalcogen layer 107 similarly.

Note that composition ratios of the respective materials in the chalcogen layer 107 and the crystallization accelerating layer 106 are observable by a method, such as Energy Dispersive X-ray Spectrometry (EDS). Moreover, it is possible to set an approximate line by the least-square method or the like or perform moving average processing or the like for the composition ratio obtained by the method, such as EDS, so as to determine the composition ratio based on the result.

Additionally, the crystalline structures, the lattice constants, and the like of the crystals contained in the chalcogen layer 107 and the crystallization accelerating layer 106 can be analyzed by a method, such as Nano Beam Diffraction (NBD).

[Melting Point of Crystallization Accelerating Layer 106]

As described above, in the reset operation, the chalcogen layer 107 is melted. Here, when the crystallization accelerating layer 106 functions as the heater, the heat in the crystallization accelerating layer 106 becomes larger than the heat in the chalcogen layer 107 in the reset operation. Here, in melting the chalcogen layer 107, when the crystallization accelerating layer 106 simultaneously melts, the constituent elements are mutually mixed to change the characteristics of the respective layers, thus possibly causing a failure in the subsequent write operation. Therefore, the melting point of the crystallization accelerating layer 106 is preferably sufficiently high enough to avoid the melt of the crystallization accelerating layer 106 in the reset operation. For example, the melting point of the crystallization accelerating layer 106 is preferably higher than the melting point of the chalcogen layer 107 by about 300° C. The melting point of the crystallization accelerating layer 106 is preferably at least higher than the melting point of the chalcogen layer 107.

The case where the chalcogen layer 107 contains $Ge_2Sb_2Te_5$ will be described as an example. Since the melting point of the fcc crystal of $Ge_2Sb_2Te_5$ is 630° C., the melting point of the crystallization accelerating layer 106 is preferably higher than 630° C. The melting point of the crystallization accelerating layer 106 is more preferably higher than 930° C.

The material of the crystallization accelerating layer 106 satisfying the condition is preferably, for example, AlSb (1060° C.), ZnTe (1295° C.), LaTe (1720° C.), CeTe (1820° C.), PrTe (1950° C.), NdTe (2025° C.), SmTe, EuTe (1526° C.), GdTe (1825° C.), TbTe, DyTe (1850° C.), HoTe (1370° C.), ErTe (1500° C.), TmTeYbTe (1730° C.), and LuTe (the values in the parentheses indicate the melting points of the respective materials).

In the case where the chalcogen layer 107 contains any other material, the melting point of the material contained in the crystallization accelerating layer 106 is preferably higher than the melting point of the material contained in the chalcogen layer 107 similarly. The melting point of the crystallization accelerating layer 106 is more preferably higher than the melting point of the chalcogen layer 107 by about 300° C.

The melting points of the materials contained in the chalcogen layer 107 and the crystallization accelerating layer 106 can be analyzed by a method for measuring a temperature at which the crystalline structure is no longer maintained by, for example, Transmission Electron Microscope (TEM) observation and the like of a cross-sectional surface in the elevated temperature of the memory cell MC. The melting point of each material can be estimated from literature values and the like.

[Bandgap and Electrical Conductivity of Crystallization Accelerating Layer 106]

As described above, when the crystallization accelerating layer 106 functions as the heater, it is preferred that the electrical conductivity of the crystallization accelerating layer 106 is low, that is, the bandgap of the crystallization accelerating layer 106 is larger. Especially, the bandgap of the crystallization accelerating layer 106 is preferably larger than the bandgap of the chalcogen layer 107. The crystallization accelerating layer 106 and the chalcogen layer 107 are arranged in series, and the same amount of the currents flow there in the operation. Since the electrical conductivity is lower in the crystallization accelerating layer 106 than the chalcogen layer 107, the range of the temperature rise is larger in the crystallization accelerating layer 106 than the chalcogen layer 107. Accordingly, the crystallization accelerating layer 106 more effectively functions as the heater.

The case where the chalcogen layer 107 contains $Ge_2Sb_2Te_5$ will be described as an example. Since the bandgap of $Ge_2Sb_2Te_5$ is 0.4 eV, the bandgap of the crystallization accelerating layer 106 is preferably higher than 0.4 eV. The material of the crystallization accelerating layer 106 satisfying the condition is preferably AlSb (1.58 eV), ZnTe (2.26 eV), and the like (the values in the parentheses indicate the bandgaps of the respective materials).

In the case where the chalcogen layer 107 contains another material, the bandgap of the material contained in the crystallization accelerating layer 106 is preferably higher than the bandgap of the material contained in the chalcogen layer 107 similarly.

The bandgap of the material contained in the crystallization accelerating layer 106 can be analyzed by a method, such as an optical absorption spectrum measurement.

[Thermal Conductivity of Crystallization Accelerating Layer 106]

As described above, the crystallization accelerating layer 106 also functions as the heat shield member for efficiently using the heat necessary for the write operation. For the function as the heat shield member, the thermal conductivity of the crystallization accelerating layer 106 is preferably low. Especially, the thermal conductivity of the crystallization accelerating layer 106 is preferably lower than the thermal conductivity of the chalcogen layer 107. This is because the Joule heat generated in the crystallization accelerating layer 106 becomes less likely to escape to the chalcogen layer 103 side.

The thermal conductivities of the materials contained in the chalcogen layer 107 and the crystallization accelerating layer 106 can be estimated from literature values and the like based on measurement values of the composition, the crystalline structure, and the like of the material contained therein.

Modification 1 of First Embodiment

[Configuration of Memory Cell MC]

Figure 7A:
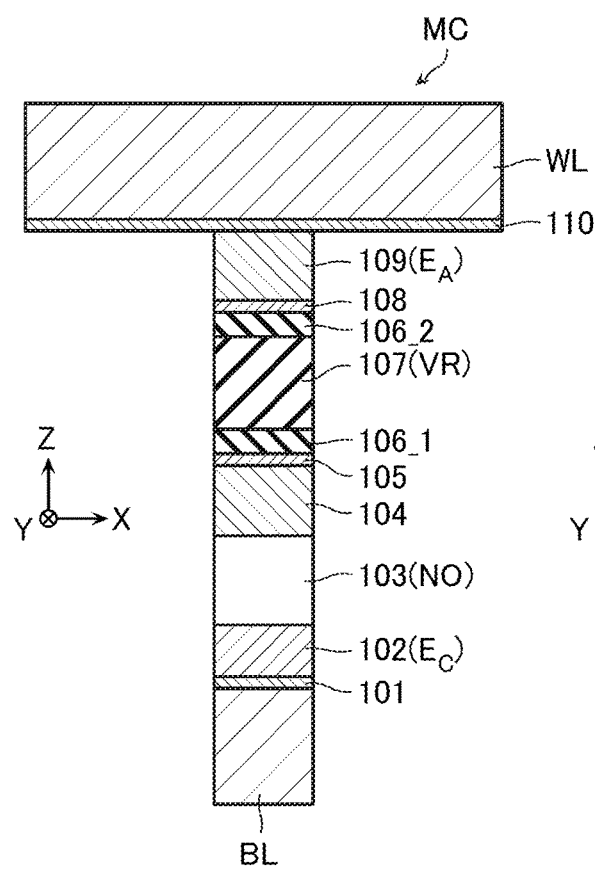
FIG. 7A is a schematic cross-sectional view of a memory cell MC of a semiconductor memory device according to a modification 1.
Figure 7B:
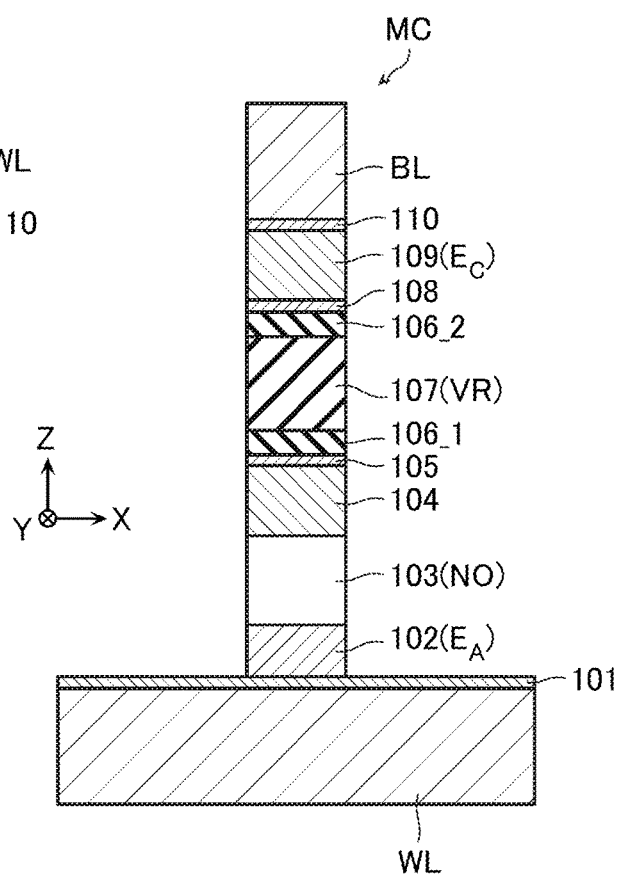
FIG. 7B is a schematic cross-sectional view of the memory cell MC of the semiconductor memory device according to the modification 1.

FIG. 7A and FIG. 7B are schematic cross-sectional views of a memory cell MC according to the modification 1 of the first embodiment. FIG. 7A corresponds to one that includes the bit line BL below and the word line WL above. FIG. 7B corresponds to one that includes the word line WL below and the bit line BL above.

As illustrated in FIG. 7A and FIG. 7B, similarly to the first embodiment, the memory cell MC according to the embodiment includes the conductive layer 102, the chalcogen layer 103, conductive layer 104, the barrier conductive layer 105, the chalcogen layer 107, the barrier conductive layer 108, and conductive layer 109 stacked in the Z-direction in this order. Meanwhile, different from the first embodiment, the memory cell MC according to the embodiment includes a crystallization accelerating layer 106_1 between the barrier conductive layer 105 and the chalcogen layer 107 instead of the crystallization accelerating layer 106. Additionally, a crystallization accelerating layer 106_2 is disposed between the chalcogen layer 107 and the barrier conductive layer 108.

The crystallization accelerating layers 106_1 and 106_2 contact the lower surface and the upper surface of the chalcogen layer 107. The crystallization accelerating layers 106_1 and 106_2 function as crystalline bases (templates) configured to control the crystalline structure of the chalcogen layer 107. The crystallization accelerating layers 106_1 and 106_2 contacts the chalcogen layer 107 from both the upper and lower surfaces, thereby allowing more preferably controlling the crystalline structure of the chalcogen layer 107. The time period until the crystallization completion of the chalcogen layer 107 can be more reduced.

The materials contained in the crystallization accelerating layers 106_1 and 106_2 may be materials, for example, similar to the material contained in the crystallization accelerating layer 106 according to the first embodiment. The materials contained in the crystallization accelerating layers 106_1 and 106_2 may have characteristics, for example, similar to those of the material contained in the crystallization accelerating layer 106 according to the first embodiment.

For example, the lattice constants of the crystals contained in the crystallization accelerating layers 106_1 and 106_2 are preferably larger than 90% and smaller than 110% of the lattice constant of the crystal contained in the chalcogen layer 107.

The melting points of the materials contained in the crystallization accelerating layers 106_1 and 106_2 are preferably higher than the melting point of the chalcogen layer 107. The melting points of the crystallization accelerating layers 106_1 and 106_2 are more preferably higher than the melting point of the chalcogen layer 107 by about 300° C. The bandgaps of the materials contained in the crystallization accelerating layers 106_1 and 106_2 are preferably higher than the bandgap of the material contained in the chalcogen layer 107.

The thermal conductivities of the materials contained in the crystallization accelerating layers 106_1 and 106_2 are preferably lower than the thermal conductivity of the chalcogen layer 107.

Modification 2 of First Embodiment

[Configuration of Memory Cell MC]

Figure 8A:
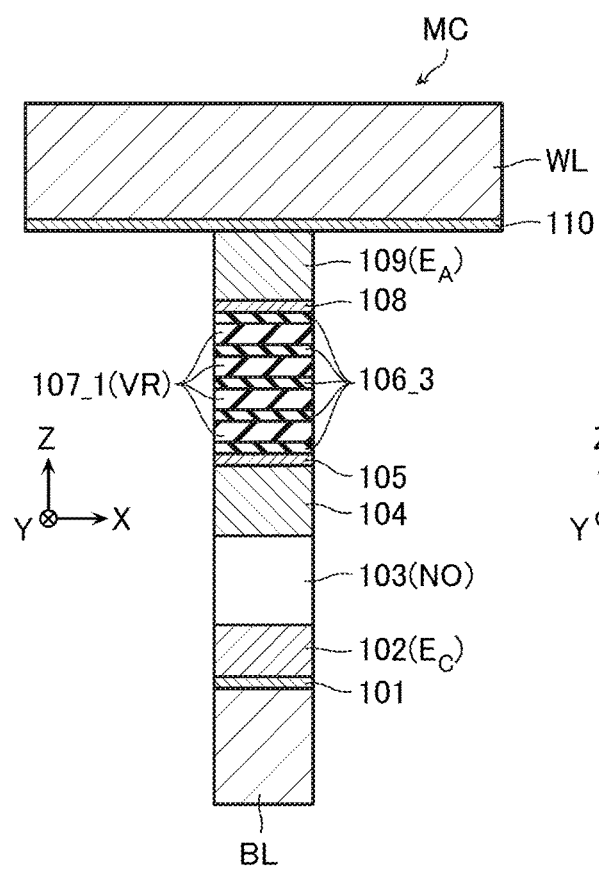
FIG. 8A is a schematic cross-sectional view of a memory cell MC of a semiconductor memory device according to a modification 2.
Figure 8B:
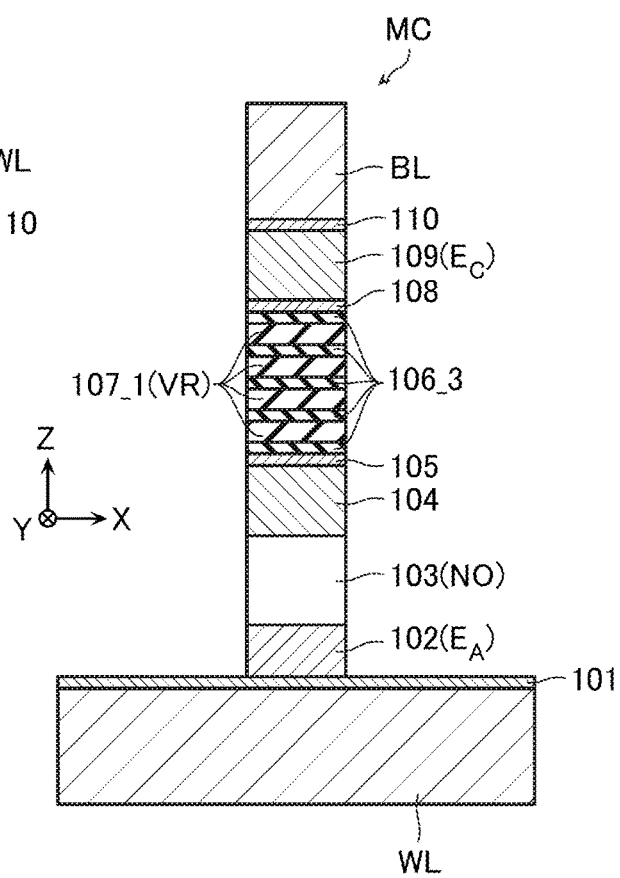
FIG. 8B is a schematic cross-sectional view of the memory cell MC of the semiconductor memory device according to the modification 2.

FIG. 8A and FIG. 8B are schematic cross-sectional views of a memory cell MC according to the modification 2 of the first embodiment. FIG. 8A corresponds to one that includes the bit line BL below and the word line WL above. FIG. 8B corresponds to one that includes the word line WL below and the bit line BL above.

As illustrated in FIG. 8A and FIG. 8B, similarly to the first embodiment, the memory cell MC according to the embodiment includes the conductive layer 102, the chalcogen layer 103, the conductive layer 104, the barrier conductive layer 105, the barrier conductive layer 108, and conductive layer 109 stacked in the Z-direction in this order. Meanwhile, different from the first embodiment, the memory cell MC according to the embodiment includes a plurality of crystallization accelerating layers 106_3 and a plurality of chalcogen layers 107_1, which are alternately stacked, between the barrier conductive layer 105 and the barrier conductive layer 108.

The plurality of crystallization accelerating layers 106_3 each contacts the lower surface and the upper surface of the plurality of chalcogen layers 107_1. The plurality of crystallization accelerating layers 106_3 function as crystalline bases (templates) configured to control the crystalline structures of the chalcogen layers 107_1.

In this modification, the chalcogen layer 107_1 is disposed by dividing into a plurality of layers while the thickness for each layer of the chalcogen layer 107_1 is thinned, thereby allowing melting the plurality of chalcogen layers 107_1 in a short time compared with the first embodiment. The plurality of crystallization accelerating layers 106_3 are disposed to the respective thinned chalcogen layers 107_1 so as to be in contact with both the upper and the lower surfaces, thereby allowing more appropriately controlling the crystalline structure of the chalcogen layer 107_1. The plurality of thinned chalcogen layers 107_1 are disposed, thereby allowing reducing the time period until completing the crystallization of all of the plurality of chalcogen layers 107_1 compared with the first embodiment.

The material contained in the crystallization accelerating layer 106_3 may be a material, for example, similar to the material contained in the crystallization accelerating layer 106 according to the first embodiment. The material contained in the crystallization accelerating layer 106_3 may have characteristics, for example, similar to those of the material contained in the crystallization accelerating layer 106 according to the first embodiment.

For example, the lattice constant of the crystal contained in the crystallization accelerating layer 106_3 is preferably larger than 90% and smaller than 110% of the lattice constant of the crystal contained in the chalcogen layer 107_1.

The melting point of the material contained in the crystallization accelerating layer 106_3 is preferably higher than the melting point of the chalcogen layer 107_1. The melting point of the crystallization accelerating layer 106_3 is more preferably higher than the melting point of the chalcogen layer 107_1 by about 300° C.

The bandgap of the material contained in the crystallization accelerating layer 106_3 is preferably higher than the bandgap of the material contained in the chalcogen layer 107_1.

The thermal conductivity of the material contained in the crystallization accelerating layer 106_3 is preferably lower than the thermal conductivity of the chalcogen layer 107_1.

Other Modifications of First Embodiment

The configurations described with reference to FIG. 3A, FIG. 3B, FIG. 7A, FIG. 7B, FIG. 8A, and FIG. 8B are merely examples, and the specific configuration is adjustable as necessary.

For example, in the example illustrated in FIG. 3A, the crystallization accelerating layer 106 may be disposed to contact the surface in the anode EA side of the chalcogen layer 107. That is, in FIG. 3A, the crystallization accelerating layer 106 may be disposed between the chalcogen layer 107 and the barrier conductive layer 108. In the example illustrated in FIG. 3B, the crystallization accelerating layer 106 may be disposed to contact the surface in the cathode EC side of the chalcogen layer 107. That is, in FIG. 3B, the crystallization accelerating layer 106 may be disposed between the chalcogen layer 107 and the barrier conductive layer 108.

In the example described with reference to FIG. 3A, FIG. 3B, FIG. 7A, FIG. 7B, FIG. 8A, and FIG. 8B, the crystallization accelerating layer 106 may be disposed to at least one of sidewall portions in the X-direction and the Y-direction of the chalcogen layer 107, 107_1. In this case, at least one of the upper surface and the lower surface of the chalcogen layer 107, 107_1 may include the crystallization accelerating layer 106, or does not need to include the crystallization accelerating layer 106.

Second Embodiment

[Schematic Configuration]

Figure 9:
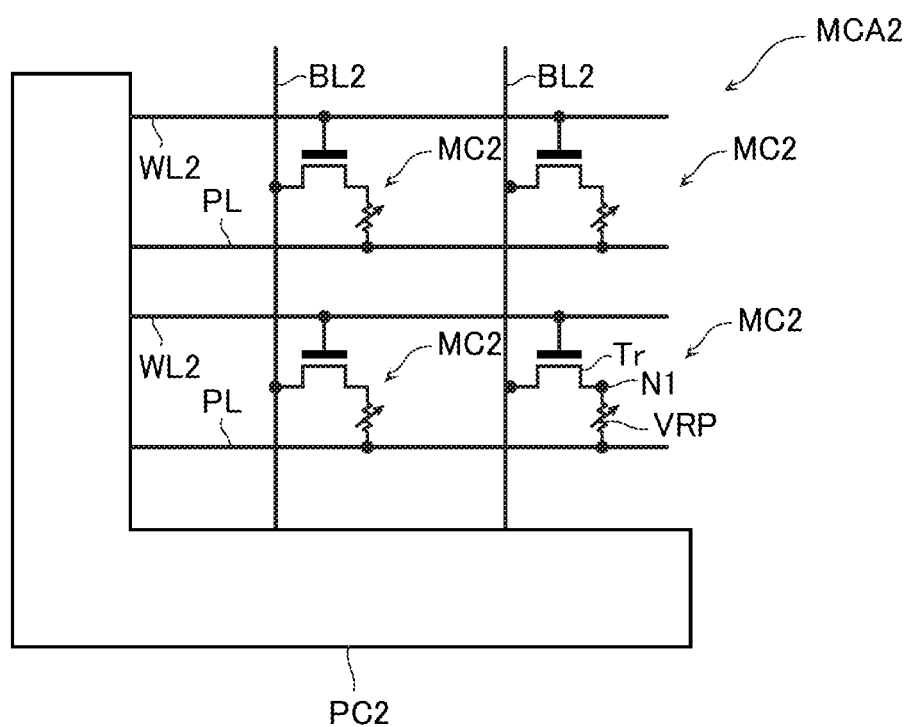
FIG. 9 is a schematic circuit diagram illustrating a part of a configuration of a semiconductor memory device according to a second embodiment.
Figure 10:
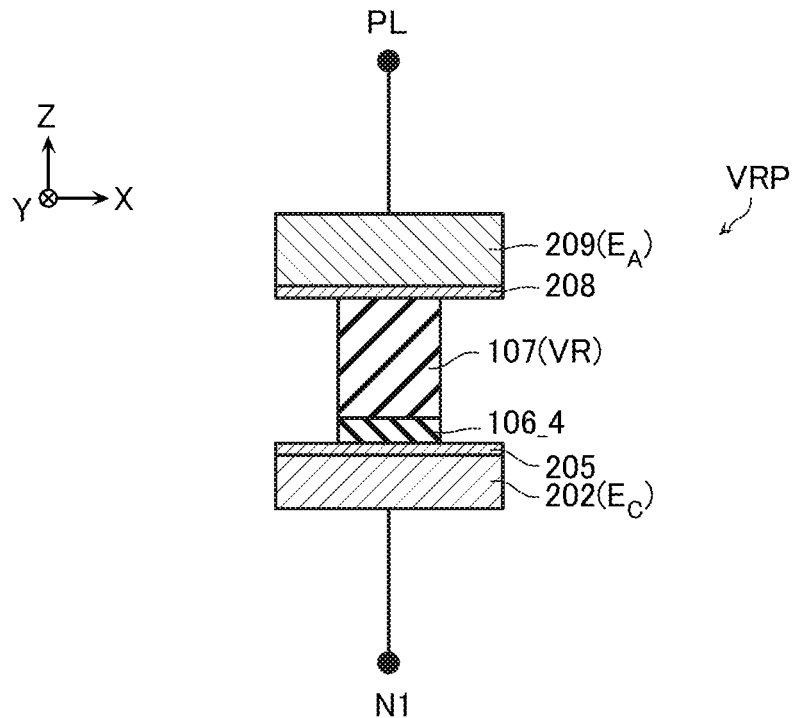
FIG. 10 is a schematic cross-sectional view of a variable resistance element unit VRP according to the semiconductor memory device.

Next, a semiconductor memory device according to the second embodiment will be described with reference to FIG. 9 and FIG. 10. FIG. 9 is a schematic circuit diagram illustrating a part of a configuration of the semiconductor memory device according to the second embodiment. FIG. 10 is a schematic cross-sectional view of a variable resistance element unit VRP according to the embodiment.

As illustrated in FIG. 9, the semiconductor memory device according to the embodiment includes a memory cell array MCA2 and a peripheral circuit PC2 that controls the memory cell array MCA2. The memory cell array MCA2 includes a plurality of word lines WL2, a plurality of plate lines PL, and a plurality of bit lines BL2. The memory cell array MCA2 includes, for example, a plurality of memory cells MC2.

Similarly to the first embodiment, the peripheral circuit PC2 includes a step down circuit, a select circuit, a sense amplifier circuit, a sequencer that controls them, and the like.

The memory cells MC2 are each connected to the bit line BL2, the word line WL2, and the plate line PL. For example, the plurality of memory cells MC2 connected to the same word line WL2 are connected to the same plate line PL. Meanwhile, the plurality of memory cells MC2 connected to the same word line WL2 are connected to the respective different bit lines BL2. The memory cell MC2 includes a field-effect type transistor Tr and a variable resistance element unit VRP.

The transistor Tr includes a gate terminal connected to the word line WL2, a drain terminal connected to the bit line BL2, and a source terminal connected to a node N1 as one end of the variable resistance element unit VRP. The transistor Tr has a function to select the memory cell MC2 as an operation target.

As illustrated in FIG. 10, the variable resistance element unit VRP includes a conductive layer 202, a barrier conductive layer 205, a crystallization accelerating layer 106_4, a chalcogen layer 107, a barrier conductive layer 208, and a conductive layer 209 stacked above a semiconductor substrate (not illustrated) in this order. The conductive layer 202, the barrier conductive layer 205, the barrier conductive layer 208, and the conductive layer 209 are basically configured similarly to the conductive layer 102, the barrier conductive layer 105, the barrier conductive layer 108, and the conductive layer 109 described with reference to FIG. 3A and FIG. 3B. However, in the example of FIG. 3A and FIG. 3B, the widths in the X-direction and the Y-direction of the conductive layer 102, the barrier conductive layer 105, the barrier conductive layer 108, and the conductive layer 109 are similar to the widths in the X-direction and the Y-direction of the crystallization accelerating layer 106 and chalcogen layer 107. Meanwhile, in the example of FIG. 10, the widths in the X-direction and the Y-direction of the conductive layer 202, the barrier conductive layer 205, the barrier conductive layer 208, and the conductive layer 209 are larger than the widths in the X-direction and the Y-direction of the crystallization accelerating layer 106_4 and the chalcogen layer 107. The conductive layer 202 is connected to not the bit line BL or the word line WL but the node N1. The conductive layer 209 is connected to not the word line WL or bit line BL but the plate line PL.

The crystallization accelerating layer 106_4 contacts the lower surface of the chalcogen layer 107. The crystallization accelerating layer 106_4 functions as a crystalline base (template) configured to control the crystalline structure of the chalcogen layer 107.

The material contained in the crystallization accelerating layer 106_4 may be a material, for example, similar to the material contained in the crystallization accelerating layer 106 according to the first embodiment. The material contained in the crystallization accelerating layer 106_4 may have characteristics, for example, similar to those of the material contained in the crystallization accelerating layer 106 according to the first embodiment.

For example, the lattice constant of the crystal contained in the crystallization accelerating layer 106_4 is preferably larger than 90% and smaller than 110% of the lattice constant of the crystal contained in the chalcogen layer 107.

The melting point of the material contained in the crystallization accelerating layer 106_4 is preferably higher than the melting point of the chalcogen layer 107. The melting point of the crystallization accelerating layer 106_4 is more preferably higher than the melting point of the chalcogen layer 107 by about 300° C.

The bandgap of the material contained in the crystallization accelerating layer 106_4 is preferably higher than the bandgap of the material contained in the chalcogen layer 107.

The thermal conductivity of the material contained in the crystallization accelerating layer 106_4 is preferably lower than the thermal conductivity of the chalcogen layer 107.

[Operation]

First, a write operation to the memory cell MC2 according to the embodiment will be described. An ON voltage is applied to the word line WL2 connected to a target memory cell MC2 as a write target, and an OFF voltage is applied to the other word lines WL2, thereby turning ON the transistor Tr of the target memory cell MC2 and turning OFF the other transistors Tr. Next, for example, a write voltage and a ground voltage are respectively applied to the bit line BL2 and the plate line PL connected to the target memory cell MC2. Consequently, the current is supplied to the variable resistance element unit VRP of the target memory cell MC2, and data is written similarly to the above-described set operation.

Next, a read operation according to the embodiment will be described. Similarly to the write operation, the transistor Tr of the target memory cell MC2 is turned ON and the other transistors Tr are turned OFF. Next, for example, a read voltage and a ground voltage are applied to the plate line PL and the bit line BL2 connected to the target memory cell MC2, respectively. Next, the current flowing in the bit line BL2 or the voltage level of the bit line BL2 is detected, thereby determining the data stored in the target memory cell MC2.

Modification of Second Embodiment

Figure 11:
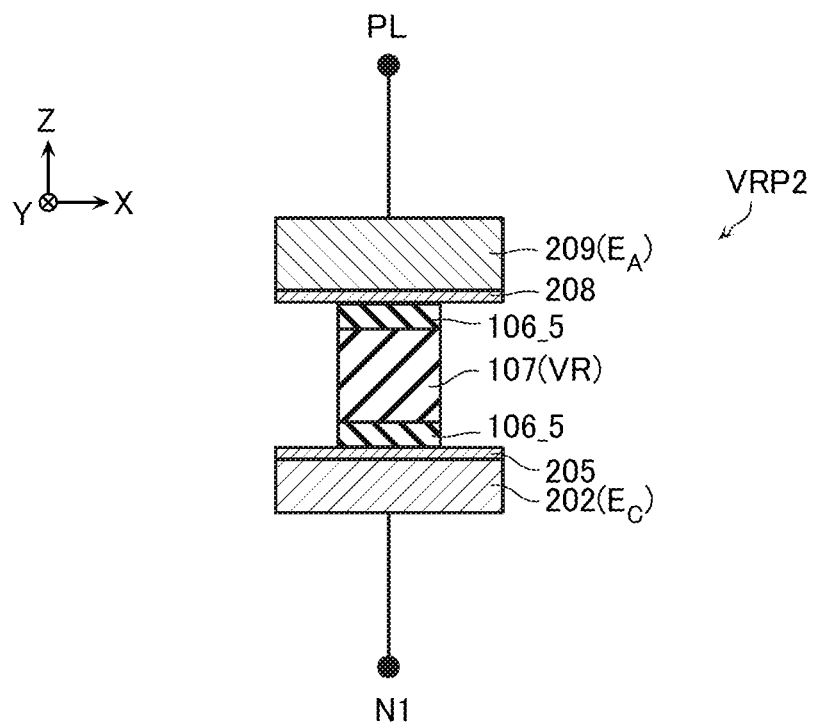
FIG. 11 is a schematic cross-sectional view of a variable resistance element unit VRP2 of a semiconductor memory device according to a modification.

FIG. 11 is a schematic cross-sectional view of a variable resistance element unit VRP2 according to the modification of the second embodiment.

As illustrated in FIG. 11, the variable resistance element unit VRP2 according to this modification is basically configured similarly to the variable resistance element unit VRP in the second embodiment. However, the variable resistance element unit VRP2 illustrated in FIG. 11 includes two crystallization accelerating layers 106_5 disposed to contact the respective upper and lower surfaces of the chalcogen layer 107 instead of the crystallization accelerating layer 106_4.

The crystallization accelerating layer 106_5 functions as a crystalline base (template) configured to control the crystalline structure of the chalcogen layer 107.

The material contained in the crystallization accelerating layer 106_5 may be a material, for example, similar to the material contained in the crystallization accelerating layer 106 according to the first embodiment. The material contained in the crystallization accelerating layer 106_5 may have characteristics, for example, similar to those of the material contained in the crystallization accelerating layer 106 according to the first embodiment.

For example, the lattice constant of the crystal contained in the crystallization accelerating layer 106_5 is preferably larger than 90% and smaller than 110% of the lattice constant of the crystal contained in the chalcogen layer 107.

The melting point of the material contained in the crystallization accelerating layer 106_5 is preferably higher than the melting point of the chalcogen layer 107. The melting point of the crystallization accelerating layer 106_5 is more preferably higher than the melting point of the chalcogen layer 107 by about 300° C.

The bandgap of the material contained in the crystallization accelerating layer 106_5 is preferably higher than the bandgap of the material contained in the chalcogen layer 107.

The thermal conductivity of the material contained in the crystallization accelerating layer 106_5 is preferably lower than the thermal conductivity of the chalcogen layer 107.

Other Embodiments

The semiconductor memory devices according to the first embodiment and the second embodiment have been described above. However, the above-described semiconductor memory devices are merely examples, and the specific configuration and the like are adjustable as necessary.

For example, in the example of FIG. 1 and FIG. 2, the two memory mats MM are arranged in the Z-direction, the lower memory mat MM includes the bit line BL positioned below and the word line WL positioned above, and the upper memory mat MM includes the word line WL positioned below and the bit line BL positioned above. The word line WL is disposed in common between the memory mat MM positioned below and the memory mat MM positioned above. However, this configuration is merely an example, for example, the bit line BL illustrated in FIG. 2 may be changed to the word line WL, and the word line WL illustrated in FIG. 2 may be changed to the bit line BL.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first electrode and a second electrode;
   a phase change layer disposed between the first electrode and the second electrode; and
   a first layer disposed between the first electrode and the phase change layer, wherein
   the phase change layer contains at least one of germanium (Ge), antimony (Sb), and tellurium (Te), and
   the first layer contains:
      aluminum (Al) and antimony (Sb), or
      tellurium (Te) and at least one of zinc (Zn), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu),
   wherein
   the first layer contains a crystal having a first lattice constant,
   the phase change layer contains a crystal having a second lattice constant, and
   the first lattice constant is larger than 90% and smaller than 110% of the second lattice constant.

2. The semiconductor memory device according to claim 1, wherein
   the first layer has a melting point higher than a melting point of the phase change layer.

3. The semiconductor memory device according to claim 1, wherein
   the first layer has a bandgap larger than a bandgap of the phase change layer.

4. The semiconductor memory device according to claim 1, wherein
   the first layer has a thermal conductivity lower than a thermal conductivity of the phase change layer.

5. The semiconductor memory device according to claim 1, wherein
   the first layer contains a cubic crystal.

6. The semiconductor memory device according to claim 1, wherein
   the phase change layer contains a cubic crystal.

7. The semiconductor memory device according to claim 1, comprising:
   a first wiring that extends in a first direction; and
   a second wiring that extends in a second direction intersecting with the first direction, wherein
   the first electrode and the second electrode are disposed between the first wiring and the second wiring.

8. The semiconductor memory device according to claim 1, comprising
   a second layer disposed between the second electrode and the phase change layer, wherein the second layer contains:
      aluminum (Al) and antimony (Sb), or
      tellurium (Te) and at least one of zinc (Zn), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

9. A semiconductor memory device comprising:
   a first electrode and a second electrode;
   a phase change layer disposed between the first electrode and the second electrode; and
   a first layer disposed between the first electrode and the phase change layer, wherein
   the phase change layer contains a cubic crystal, and
   the first layer contains a crystal of a sphalerite structure,
   wherein
   the first layer contains a crystal having a first lattice constant,
   the phase change layer contains a crystal having a second lattice constant, and
   the first lattice constant is larger than 90% and smaller than 110% of the second lattice constant.

10. The semiconductor memory device according to claim 9, wherein
    the first layer has a melting point higher than a melting point of the phase change layer.

11. The semiconductor memory device according to claim 9, wherein
    the first layer has a bandgap larger than a bandgap of the phase change layer.

12. The semiconductor memory device according to claim 9, wherein
    the first layer has a thermal conductivity lower than a thermal conductivity of the phase change layer.

13. The semiconductor memory device according to claim 9, comprising:
    a first wiring that extends in a first direction; and
    a second wiring that extends in a second direction intersecting with the first direction, wherein
    the first electrode and the second electrode are disposed between the first wiring and the second wiring.

14. A semiconductor memory device comprising:
    a first electrode and a second electrode;
    a phase change layer disposed between the first electrode and the second electrode; and
    a first layer disposed between the first electrode and the phase change layer, wherein
    the phase change layer contains a cubic crystal, and
    the first layer contains a crystal of a face-centered cubic lattice structure,
    wherein
    the first layer contains a crystal having a first lattice constant,
    the phase change layer contains a crystal having a second lattice constant, and the first lattice constant is larger than 90% and smaller than 110% of the second lattice constant.

15. The semiconductor memory device according to claim 14, wherein
the first layer has a melting point higher than a melting point of the phase change layer.

16. The semiconductor memory device according to claim 14, wherein
the first layer has a thermal conductivity lower than a thermal conductivity of the phase change layer.

17. The semiconductor memory device according to claim 14, comprising:
a first wiring that extends in a first direction; and
a second wiring that extends in a second direction intersecting with the first direction, wherein
the first electrode and the second electrode are disposed between the first wiring and the second wiring.

* * * * *